United States Patent
Xu et al.

(10) Patent No.: US 11,489,028 B2
(45) Date of Patent: Nov. 1, 2022

(54) DISPLAY SUBSTRATE, METHOD FOR FABRICATING THE SAME, AND DISPLAY DEVICE

(71) Applicant: BOE Technology Group Co., Ltd., Beijing (CN)

(72) Inventors: Chuanxiang Xu, Beijing (CN); Shi Shu, Beijing (CN); Qi Yao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 160 days.

(21) Appl. No.: 16/943,689

(22) Filed: Jul. 30, 2020

(65) Prior Publication Data

US 2021/0036077 A1    Feb. 4, 2021

(51) Int. Cl.
*H01L 27/32* (2006.01)
*H01L 51/56* (2006.01)

(52) U.S. Cl.
CPC ......... *H01L 27/3258* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2015/0227010 A1* | 8/2015 | Anjo | H01L 27/1222 349/42 |
| 2018/0182291 A1* | 6/2018 | Hanari | G09G 3/3216 |
| 2019/0221585 A1* | 7/2019 | Tominaga | G02F 1/136286 |
| 2021/0288129 A1* | 9/2021 | Okabe | H01L 27/3276 |

* cited by examiner

*Primary Examiner* — J. E. Schoenholtz
(74) *Attorney, Agent, or Firm* — Nath, Goldberg & Meyer; Joshua B. Goldberg

(57) ABSTRACT

The disclosure provides a display substrate, a fabrication method thereof and a display device. The display substrate includes a base, and has a display area and a frame area. The method includes: forming an active region of a thin film transistor in the display area; forming a first lead in the frame area; forming a buffer layer directly covering the first lead; forming a connection via hole communicating with the active region; forming a protective layer directly covering the buffer layer in the frame area; cleaning the active region exposed by the connection via hole after forming the protective layer; removing the protective layer in the frame area after cleaning; and forming a second lead in the frame area after removing the protective layer, an orthographic projection of the second lead on the base and an orthographic projection of the first lead on the base at least partially overlap.

16 Claims, 4 Drawing Sheets

DISPLAY SUBSTRATE, METHOD FOR FABRICATING THE SAME, AND DISPLAY DEVICE

CROSS-REFERENCE TO RELATED APPLICATION

This application claims priority to Chinese Patent Application No. 201910695273.5, filed on Jul. 30, 2019, the entire contents of which are hereby incorporated by reference.

TECHNICAL FIELD

The present disclosure belongs to the technical field of display technologies, and particularly relates to a display substrate, a method for fabricating the same and a display device.

BACKGROUND

Flexible display substrates are considered to be the mainstream of next-generation displays and have attracted extensive attention due to their characteristics of being light, thin, portable, bendable, and the like. However, when the bending radius R of an existing flexible display substrate is small (e.g., R<3 mm), an inorganic layer structure such as an insulating interlayer layer in the display substrate is easily broken, which causes display defects.

SUMMARY

In an aspect, embodiments of the present disclosure provide a method for fabricating a display substrate, the display substrate includes a base substrate, and has a display area and a frame area; the method includes:

forming an active region of a thin film transistor in the display area;

forming a first lead in the frame area;

forming a buffer layer directly covering the first lead;

forming a connection via hole communicating with the active region to expose the active region;

forming a protective layer directly covering the buffer layer in the frame area;

cleaning the active region exposed by the connection via hole after forming the protective layer;

removing the protective layer in the frame area after the cleaning; and after removing the protective layer, forming a second lead in the frame area, wherein an orthographic projection of the second lead on the base substrate and an orthographic projection of the first lead on the base substrate are at least partially overlapped.

Optionally, forming the protective layer directly covering the buffer layer in the frame area includes:

forming a pattern of a photoresist layer, wherein an orthographic projection of the photoresist layer on the base substrate is not overlapped with an orthographic projection on the base substrate of a region where the connection via hole is to be formed, and the photoresist layer directly covers the buffer layer in the frame area and serves as the protective layer.

Optionally, between forming the buffer layer directly covering the first lead and forming the pattern of the photoresist layer, the method further includes: forming a pattern of an insulating interlayer layer using an organic material, wherein the insulating interlayer layer is provided with a first opening, an orthographic projection of the first opening on the base substrate is overlapped with the orthographic projection on the base substrate of the region where the connection via hole is to be formed, and the insulating interlayer layer is not provided in the frame area;

forming the pattern of the photoresist layer includes: forming a photoresist layer only in the frame area; and forming the connection via hole communicating with the active region includes: forming a connection via hole communicating with the active region by etching using the insulating interlayer layer and the photoresist layer as a mask.

Optionally, forming the protective layer directly covering the buffer layer in the frame area includes:

forming a pattern of an insulating interlayer layer using an organic material, wherein the insulating interlayer layer is provided with a first opening, an orthographic projection of the first opening on the base substrate is overlapped with an orthographic projection on the base substrate of a region where the connection via hole is to be formed, and the insulating interlayer layer directly covers the buffer layer in the frame area and serves as the protective layer;

forming the connection via hole communicating with the active region includes: forming a connection via hole communicating with the active region by etching using the insulating interlayer layer as a mask; and removing the protective layer in the frame area includes: removing the insulating interlayer layer in the frame area, and keeping the insulating interlayer layer in other area than the frame area.

Optionally, the display substrate is a flexible display substrate, and the display substrate further includes a bendable area on a side of the frame area distal to the display area; the method further includes:

forming a groove in the bendable area, wherein the groove and the connection via hole communicating with the active region are formed in a same step; and forming a filling structure in the groove using a flexible material.

Optionally, forming the protective layer directly covering the buffer layer in the frame area includes: forming the protective layer directly covering the buffer layer in the frame area while forming the filling structure in the groove using the flexible material; and removing the protective layer in the frame area includes: removing the flexible material in the frame area and keeping the filling structure.

Optionally, before forming the active region of the thin film transistor in the display area, the method further includes:

forming a barrier layer; and forming the groove in the bendable area includes: forming a groove which enters the barrier layer but does not penetrate through the barrier layer in the bendable area.

Optionally, before forming the groove in the bendable area, the method further includes:

forming a pattern of an insulating interlayer layer using an organic material, wherein the insulating interlayer layer is provided with a first opening and a second opening, an orthographic projection of the first opening on the base substrate is overlapped with an orthographic projection on the base substrate of a region where the connection via hole is to be formed, and an orthographic projection of the second opening on the base substrate is overlapped with an orthographic projection on the base substrate of a region where the groove is to be formed; and forming a photoresist layer in the frame area;

forming the connection via hole communicating with the active region includes: forming a connection via hole communicating with the active region by etching using the insulating interlayer layer and the photoresist layer as a mask; and forming the groove in the bendable area includes: forming a groove in the bendable area by etching using the insulating interlayer layer and the photoresist layer as a mask; and before forming the filling structure in the groove using the flexible material, the method further includes: removing the photoresist layer.

Optionally, before forming the groove in the bendable area, the method further includes:

forming a pattern of an insulating interlayer layer using an organic material, wherein the insulating interlayer layer is provided with a first opening and a second opening, an orthographic projection of the first opening on the base substrate is overlapped with an orthographic projection on the base substrate of a region where the connection via hole is to be formed, an orthographic projection of the second opening on the base substrate is overlapped with an orthographic projection on the base substrate of a region where the groove is to be formed, and part of the insulating interlayer layer in the frame area serves as the protective layer;

forming the connection via hole communicating with the active region includes: forming a connection via hole communicating with the active region by etching using the insulating interlayer layer as a mask;

forming the groove in the bendable area includes: forming a groove in the bendable area by etching using the insulating interlayer layer as a mask; and removing the protective layer in the frame area includes: removing the insulating interlayer layer in the frame area, and keeping the insulating interlayer layers in other area than the frame area.

Optionally, between forming the active region of the thin film transistor in the display area and forming the first lead in the frame area, the method further includes:

forming a gate insulating layer;

forming a gate of the thin film transistor; and forming a first insulating layer.

Optionally, the method further includes:

forming a source and a drain of the thin film transistor;

wherein the source and the drain of the thin film transistor are formed in the same step as the second lead in the frame area.

Optionally, the buffer layer is made of an inorganic material.

Optionally, a thickness of the buffer layer is between 10 nm and 200 nm.

Optionally, cleaning the active region exposed by the connection via hole includes:

cleaning the active region exposed by the connection via hole using a cleaning agent containing hydrogen fluoride.

Optionally, the display substrate is an organic light emitting diode display substrate.

Optionally, the display substrate is a flexible display substrate.

In another aspect, the embodiments of the present disclosure provide a display substrate, wherein the display substrate is fabricated by the above method for fabricating a display substrate.

In another aspect, the embodiments of the present disclosure provide a display device including the above display substrate.

DETAILED DESCRIPTION

Figure 1:
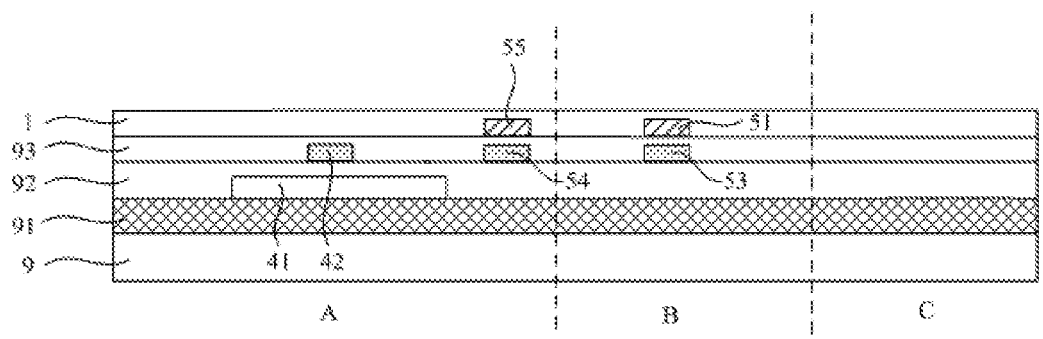
FIG. 1 is a schematic cross-sectional view of a structure after forming a buffer layer in a method for fabricating a display substrate according to an embodiment of the present disclosure.

In order to enable those skilled in the art to better understand the technical solutions of the present disclosure, the present disclosure will be described in further detail below in conjunction with the accompanying drawings and specific implementations.

It is to be understood that the specific embodiments and drawings described herein are merely for the purpose of explaining rather than limiting the present invention.

It is to be understood that various embodiments and features of the embodiments may be combined with each other without conflict.

It is to be understood that, for the convenience of description, only parts related to the present invention are shown in the drawings of the present disclosure, and parts not related to the present invention are not shown in the drawings.

It should be understood that each unit or module in the embodiments of the present disclosure may correspond to only one physical structure, and may also be composed of multiple physical structures, or multiple units or modules may be integrated into one physical structure.

Noun Explanation

In the present disclosure, unless otherwise specified, the following technical terms should be understood according to the following explanations:

"A directly covers B" means that A is formed after B is formed from the view of stack relationship, and a side of B distal to the base substrate is in direct contact with A.

"Patterning process" refers to a step of forming a structure having a specific pattern, and may be a photolithography process including one or more steps of forming a material layer, coating a photoresist, exposing, developing, etching, stripping the photoresist, and the like; needless to say, the patterning process may also be other process such as an imprinting process, an inkjet printing process, or the like.

Multiple structures formed "in a same layer" refers to that the multiple structures are formed from a same material layer and thus are in a same layer from the view of stack relationship, but does not mean that they have a same distance from the base substrate nor that layer structures between each one of the multiple structures and the base substrate are exactly the same.

Multiple structures formed "in a same step" refers to that the multiple structures are formed simultaneously by a same process step, for example, formed from a same material layer by a same patterning process (i.e., in a same layer), or that multiple hole-like structures are formed by a same etching process.

A display substrate generally includes a display area in which a pixel structure such as a thin film transistor are disposed, and a frame area in which a lead is disposed, and the frame area includes a buffer layer directly covering the first lead. In a fabricating process of the display substrate, after the buffer layer is formed, it is necessary to form a connection via hole communicating with the active region of the thin film transistor (the connection via hole needs to penetrate through the buffer layer and also penetrate through other insulating layers such as a gate insulating layer), and clean the active region exposed by the connection via hole to remove impurities on a surface of the active region and prevent poor connection between the active region and a source and a drain. However, the cleaning agent (e.g., hydrofluoric acid) used for cleaning may react with the buffer layer, which leads to a crack in the buffer layer, and as a result structures respectively on and under the buffer layer are short-circuited.

First Embodiment

The embodiment of the present disclosure provides a method for fabricating a display substrate, the fabricated display substrate includes a base substrate, and has a display area and a frame area; the method includes:

forming an active region of a thin film transistor in the display area;

forming a first lead in the frame area;

forming a buffer layer directly covering the first lead;

forming a connection via hole exposing the active region;

forming a protective layer directly covering the buffer layer in the frame area;

cleaning the active region exposed by the connection via hole after the protective layer is formed;

removing the protective layer in the frame area after cleaning; and forming a second lead in the frame area after removing the protective layer, wherein an orthographic projection of the second lead on the base substrate and an orthographic projection of the first lead on the base substrate are at least partially overlapped.

In the method for fabricating a display substrate of the embodiment of the present disclosure, when cleaning the active region, the buffer layer in the frame area is covered by the protective layer, therefore no crack will be generated in the buffer layer due to the cleaning, conduction between the first lead and the second lead can be avoided, and short-circuit failure is eliminated; meanwhile, the protective layer is removed before forming the second lead, and thus the final product does not include an additional protective layer, and performance of the product is not adversely affected.

Second Embodiment

Hereinafter, a method for fabricating a display substrate according to an embodiment of the present disclosure will be described in detail with reference to FIGS. 1 to 6.

In an embodiment, the display substrate includes a display area A and a frame area B, which may be adjacent to each other. The display substrate may be an array substrate, and the display area A refers to an area in which pixel structures such as a thin film transistor, a storage capacitor, an organic light emitting diode, a gate line, a data line, and a power line are disposed, that is, pixels (or sub-pixels) for displaying are all disposed in the display area A. The frame area B is adjacent to the display area A and is has leads disposed therein, and a signal required by each pixel structure in the display area A can be introduced into the display area A through the leads.

Optionally, the display substrate is an organic light emitting diode display substrate.

The display substrate fabricated according to the embodiment of the present disclosure can be an organic light emitting diode (OLED) display substrate. Since the organic light emitting diode is susceptible to failure due to moisture and oxygen ($O_2$), resulting in dark spots, shortened service life, and the like, the display area A of the OLED display substrate generally needs to be encapsulated by an encapsulation layer 95, and in this case, the buffer layer 1 in the OLED display substrate can also prevent moisture and oxygen from entering, so as to prevent moisture and oxygen from permeating into the display area A from insulating layers (e.g., insulating layers made of organic materials) below the buffer layer 1.

Optionally, the display substrate is a flexible display substrate.

The display substrate fabricated according to the embodiment of the present disclosure can be wholly or locally flexible, so that the display substrate is light, thin, portable and bendable. In order to avoid damage of the flexible display substrate when the bending radius is smaller (e.g., smaller than 3 mm), each insulating layer in the flexible display substrate may be made of a soft organic material, and the buffer layer 1 may have a small thickness, so that it is more important to ensure that no crack is generated in the buffer layer 1.

Optionally, the flexible display substrate further includes a bendable area C (or pad bending area) on a side of the frame area B distal to the display area A.

The bendable area C is located on the side of the frame area B distal to the display area A, and has a driving circuit board and the like disposed therein to introduce a driving signal into the display substrate. The bendable area C can be bent, so that the driving circuit board can be folded to the back of the display device to be invisible from outside, thereby improving screen-to-body ratio of the display device, and realizing a narrow bezel.

Needless to say, it should be understood that the display substrate may satisfy some or all of the above conditions at the same time, that is, the display substrate may be a flexible organic light emitting diode display substrate and include a bendable area C.

Thereinafter, description is given by taking a case where the display substrate is a flexible OLED display substrate having a bendable area C as an example, and in this case the corresponding fabricating method may include steps S201 to S207.

At step S201, an active region 41 and a first lead 51 are formed.

Before a buffer layer 1 is formed and cleaning is performed, part of structures such as an active region 41 of a thin film transistor (e.g., a switching transistor, a driving transistor, or the like) of a pixel structure is formed in the display area A, and a first lead 51 for introducing a specific signal into the display area A is formed in the frame area B.

Needless to say, in the display area A, there are actually a plurality of thin film transistors each having a corresponding active region 41 and the like.

Optionally, this step (S201) may include steps S2011 to S2016.

At step S2011, a barrier layer 91 is formed on a base substrate 9.

That is, a barrier layer 91 is directly formed on a flexible base substrate 9 (e.g., polyimide substrate 9) of the display substrate, and the barrier layer 91 can not only block entry of moisture, oxygen, and the like, but also enhance connection of other structures with the base substrate 9.

The barrier layer 91 may be a complete layer, in other words, the barrier layer 91 is formed in the display area A, the frame area B and the bendable area C, and the barrier layer 91 in the display area A, the barrier layer 91 in the frame area B and the barrier layer 91 in the bendable area C are formed to be a single layer.

At step S2012, an active region 41 of the thin film transistor is formed in the display area A.

By a patterning process, an active region 41 of the thin film transistor is formed on a side of the barrier layer 91 distal to the base substrate 9.

Optionally, the active region 41 is formed of a silicon-based semiconductor material, such as polysilicon (p-Si), since the buffer layer 1 is more likely to be damaged during cleaning of the silicon-based semiconductor material.

At step S2013, a gate insulating layer 92 is formed.

A gate insulating (GI) layer 92 directly covering the active region 41 is formed.

The gate insulating layer 92 may be a complete layer, in other words, the gate insulating layer 92 is formed in the display area A, the frame area B and the bendable area C, and the gate insulating layer 92 in the display area A, the gate insulating layer 92 in the frame area B and the gate insulating layer 92 in the bendable area C are formed to be a single layer.

Optionally, to improve bending performance of the display substrate, the gate insulating layer 92 may be made of an organic material.

At step S2014, a gate 42 of the thin film transistor is formed in the display area A.

A gate 42 of the thin film transistor may be formed on a side of the gate insulating layer 92 distal to the base substrate 9 by a patterning process, and in this case, the thin film transistor has a top-gate structure. Needless to say, the display substrate of the present disclosure may also have a bottom-gate structure.

Optionally, while forming the gate 42, other conductive structures, such as a third lead 53 and a fourth lead 54, which are in the same layer as the gate 42, may also be simultaneously formed in the frame area B and the display area A, respectively.

At step S2015, a first insulating layer 93 is formed.

A first insulating layer 93 directly covering the gate 42 is formed on a side of the gate 42 distal to the gate insulating layer 92. In the presence of the third lead 53 and the fourth lead 54 disposed in the same layer as the gate 42, the first insulating layer 93 also covers both the third lead 53 and the fourth lead 54.

The first insulating layer 93 may be a complete layer. In other words, the first insulating layer 93 is formed in the display area A, the frame area B, and the bendable area C, and the first insulating layers 93 in the display area A, the first insulating layers 93 in the frame area B, and the first insulating layers 93 in the bendable area C are formed to be a single layer.

Optionally, to improve the bending performance of the display substrate, the first insulating layer 93 may be made of an organic material.

At step S2016, a first lead 51 is formed in the frame area B.

On a side of the first insulating layer 93 distal to the gate 42 (or distal to the third lead 53), a first lead 51 is formed in the frame area B by a patterning process.

Optionally, while forming the first lead 51, other conductive structure, such as a fifth lead 55, which is in the same layer as the first lead 51, may be simultaneously formed in the display area A.

At step S202, a buffer layer 1 directly covering the first lead 51 is formed.

The buffer layer 1 is formed, so as to obtain the structure shown in FIG. 1, and in the frame area B, the buffer layer 1 directly covers the first lead 51, that is, a surface of the first lead 51 distal to the base substrate 9 is in direct contact with the buffer layer 1.

Optionally, the buffer layer 1 is made of an inorganic material.

The buffer layer 1 may be made of an inorganic material. This is because the first insulating layer 93, the gate insulating layer 92, and the like below the buffer layer 1 are generally made of an organic material, and moisture and oxygen easily permeate through these organic insulting layers into the display area A, and therefore the frame area B needs to be sealed by the buffer layer 1 made of an inorganic material having a strong ability of blocking moisture and oxygen to prevent moisture and oxygen from contacting with the organic insulating layers below the buffer layer.

Optionally, the buffer layer 1 has a thickness between 10 nm and 200 nm.

When the thickness of the buffer layer 1 is large (e.g., greater than 400 nm), cracks can be prevented from occurring during the cleaning process, but the excessively thick buffer layer 1 (especially the buffer layer 1 made of an inorganic material) is easily damaged during bending, so that the bending radius of the flexible display substrate is limited (e.g., a bending radius less than 3 mm cannot be realized). Therefore, the buffer layer 1 preferably has a small thickness.

At step S203, a protective layer 11 and connection via holes 21 are formed.

A connection via hole 21 communicating with the active region 41 is formed at a predetermined position of each insulating layer (e.g., the gate insulating layer 92, the first insulating layer 93, and the buffer layer 1) above the active region 41 (in other words, the connection via hole 21 penetrates through each insulating layer to expose the active region 41), and a protective layer 11 directly covering the buffer layer 1 is formed on a side of the buffer layer 1 distal to the first insulating layer 93 and in the frame area B.

The connection via holes 21 are configured for a source 43 and a drain 44 to be formed later to be coupled to the active region 41, and the protective layer 11 is used to protect the buffer layer 1 during the cleaning process.

Needless to say, there should be two spaced connection via holes 21 for each active region 41, and the gate 42 should be located between the two connection via holes 21.

Optionally, this step (S203) may include steps S2031 to S2034.

At step S2031, a pattern of an insulating interlayer layer 3 is formed by using an organic material, the insulating interlayer layer 3 is provided with a first opening 23, and an orthographic projection of the first opening 23 on the base substrate 9 coincides with an orthographic projection on the base substrate 9 of a region where the connection via hole 21 is to be formed.

A pattern of an insulating interlayer layer 3 (OILD) is formed on a side of the buffer layer 1 distal to the first insulating layer 93 by a patterning process using an organic material, and the material for forming the insulating interlayer layer 3 may be an organic material, which is beneficial to improving the bending performance of the flexible display substrate.

The insulating interlayer layer 3 is not provided in the frame area B, and therefore the buffer layer 1 in the frame area B is exposed after this step. Meanwhile, the insulating interlayer layer 3 is provided in the display area A and has first openings 23 at positions corresponding to the connection via holes 21.

Optionally, the insulating interlayer layer 3 is provided in the bendable area C, and has a second opening 24 in the bendable area C. An orthographic projection of the second opening 24 on the base substrate 9 coincides with an orthographic projection on the base substrate 9 of a region where the groove 22 is to be formed.

At step S2032, a pattern of a photoresist layer 7 is formed on a side of the insulating interlayer layer 3 and the protective layer 11 distal to the buffer layer 1, an orthographic projection of the photoresist layer 7 on the base substrate 9 does not overlap with the orthographic projection on the base substrate 9 of the region where the connection via hole 21 is to be formed, and part of the photoresist layer 7 in the frame area B directly covers the buffer layer 1 to serve as the protective layer 11.

Optionally the orthographic projection of the photoresist layer 7 on the base substrate 9 does not overlap with an orthographic projection on the base substrate 9 of the region where the groove 22 is to be formed.

Figure 2:
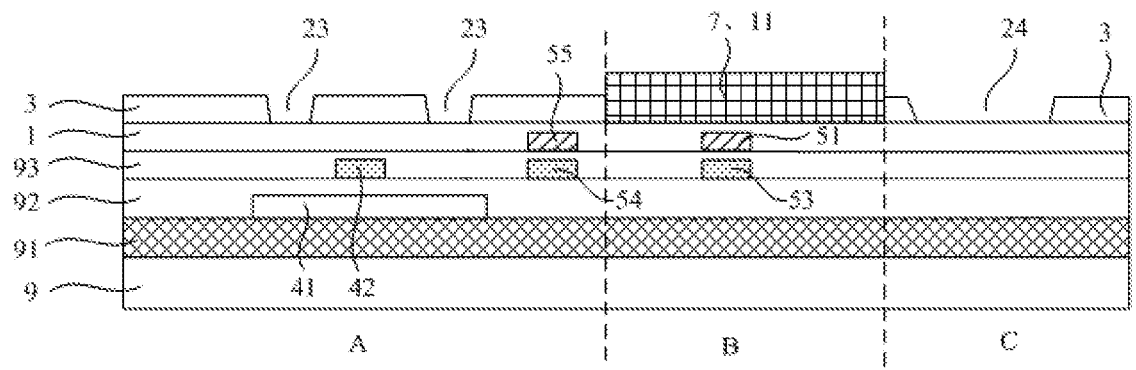
FIG. 2 is a schematic cross-sectional view of a structure before forming a connection via hole in a method for fabricating a display substrate according to an embodiment of the present disclosure.

The pattern of the photoresist layer 7 is formed by exposure and development, and the photoresist layer 7 directly covers the buffer layer 1 in the frame area B, so that the photoresist layer 7 in the frame area B also serves as the protective layer 11, thereby forming the structure shown in FIG. 2. Of course, the photoresist layer 7 should not affect formation of the connection via holes 21 and the groove 22, and therefore there is no photoresist layer at positions corresponding to these structures.

Optionally, the photoresist layer 7 is only located in the frame area B.

In the case of having the above insulating interlayer layer 3, the photoresist layer 7 may be located only in the frame area B, and not provided in other area than the frame area B.

Of course, it is possible if the photoresist layer 7 has the same pattern as the insulating interlayer layer 3 in the display area A and the bendable area C; alternatively, it is also possible to replace the insulating interlayer layer with the photoresist layer 7 if there is no insulating interlayer layer.

At step S2033, a connection via hole 21 communicating with the active region 41 is formed by etching using the insulating interlayer layer 3 and the photoresist layer 7 as a mask.

The insulating layers (the first insulating layer 93, the gate insulating layer 92, and the buffer layer 1) exposed by the first opening 23 are removed by etching using the insulating interlayer layer 3 and the photoresist layer 7 as a mask, thereby forming a connection via hole 21. Of course, it will be appreciated that at this time the connection via hole 21 is actually integrated with the first opening 23, that is, the first opening 23 may be considered as part of the connection via hole 21.

Optionally, this step (S2032) may further include: forming the groove 22 corresponding to the second opening 24 simultaneously by etching using the insulating interlayer layer 3 and the photoresist layer 7 as a mask.

Figure 3:
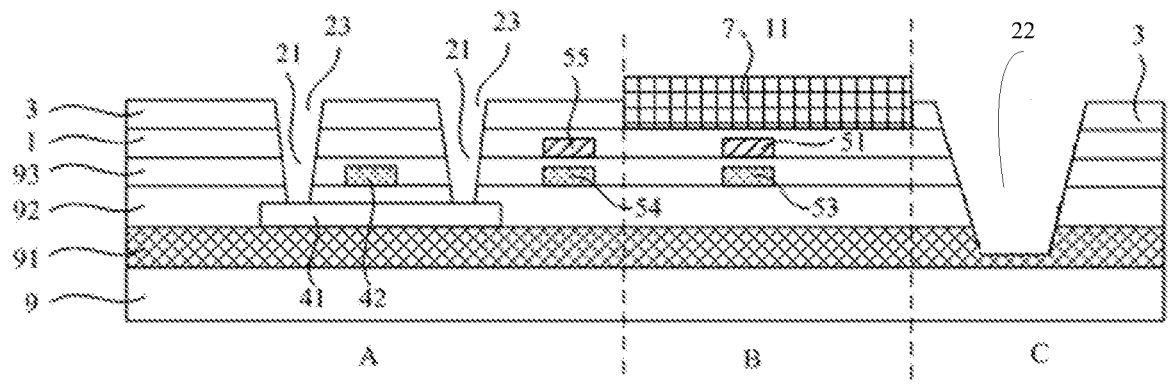
FIG. 3 is a schematic cross-sectional view of a structure before cleaning in a method for fabricating a display substrate according to an embodiment of the present disclosure.

When the insulating interlayer layer 3 has the second opening 24 in the bendable area C, the insulating layers (the first insulating layer 93, the gate insulating layer 92, and the buffer layer 1) at the position corresponding to the second opening 24 are also removed to form the groove 22 while forming the connection via hole 21 by etching, thereby obtaining the structure shown in FIG. 3.

By forming the groove 22, the thickness of the structure in the bendable area C can be reduced, so that the bendable area C can be better bent.

Optionally, forming the groove 22 may include: forming, in the bendable area C, a groove 22 that enters the barrier layer 91 but does not penetrate the barrier layer 91.

Since there is no active region at the positon corresponding to the second opening 24, the barrier layer 91 at this position can also be etched. In this step, the etchant, the etching time, and the like can be controlled so as to etch away a portion of the barrier layer 91, but not etch through the barrier layer 91, that is, to allow the groove 22 to enter the barrier layer 91, but not penetrate the barrier layer 91, for example, to allow a distance of 10 nm to 100 nm between the bottom of the groove 22 and the base substrate 9 (the total thickness of the barrier layer 91 should be larger than this distance). Thus, film layers in the bendable area C can be removed as much as possible, the bending effect can be improved to the maximum extent, and meanwhile the base substrate 9 can be prevented from being corroded.

At step S2034, a filling structure 6 is formed in the groove 22 using a flexible material.

To ensure the flatness of the bendable area C, it is necessary to form a filling structure 6 in the groove 22 by a patterning process using a flexible material, so as to substantially fill and level up the groove 22.

The material for forming the filling structure 6 may be Polyimide (PT), which is flexible and will not adversely affect the bending.

At step S204, the active region 41 exposed by the connection via hole 21 is cleaned.

It can be seen that at this time, parts of a surface of the active region 41 are exposed by the connection via holes 21, and these parts of the surface (referred to as contact surface) are configured to contact with a source 43 and a drain 44 that are subsequently formed. In order to avoid occurrence of a defective connection between the active region 41 and the source 43 and the drain 44 and to increase the contact resistance, it is necessary to clean the exposed contact surface of the active region 41 to remove impurities on the contact surface.

Referring to FIG. 3, at this time, the buffer layer 1 in the frame aa B is directly covered by the protective layer 11 (the photoresist layer 7), so that the buffer layer 1 is not affected by the cleaning process, and no cracks are generated in the buffer layer 1, thereby ensuring that the second lead 52 subsequently formed on the buffer layer 1 and the first lead 51 formed under the buffer layer 1 are not electrically connected.

Optionally, this step (S204) may include: cleaning the active region 41 exposed by the connection via hole 21 using a cleaning agent containing hydrogen fluoride.

For example, the buffer layer 1 may be cleaned with a Hydrogen Fluoride (HF) cleaning agent, which is particularly suitable for the embodiment of the present disclosure because HF cleaning agent can easily cause damage to the buffer layer 1.

At step S205, the protective layer 11 in the frame area B is removed.

Figure 4:
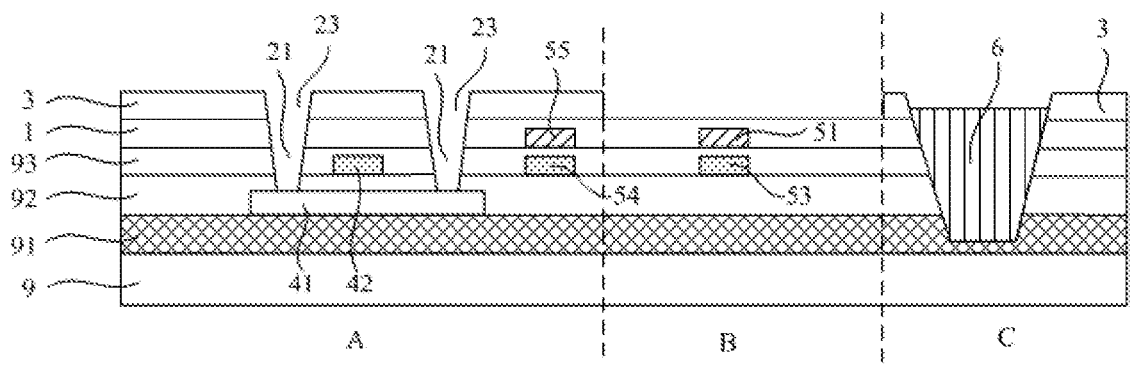
FIG. 4 is a schematic cross-sectional view of a structure after removing a protective layer in a method for fabricating a display substrate according to an embodiment of the present disclosure.

The protective layer 11 in the frame area B is removed, so as to obtain the structure shown in FIG. 4, so that there is no protective layer in the final product, and influence of the protective layer 11 on the performance of the product is avoided.

Optionally, when the protective layer 11 is the photoresist layer 7, the step (S205) includes: removing all of the photoresist layer 7.

That is, all of the photoresist layer 7 (protective layer 11) may be removed by photoresist stripping, ashing, or the like.

At step S206, a second lead 52 is formed in the frame area B, an orthographic projection of the second lead 52 on the base substrate 9 is at least partially overlapped with an orthographic projection of the first lead 51 on the base substrate 9.

Figure 5:
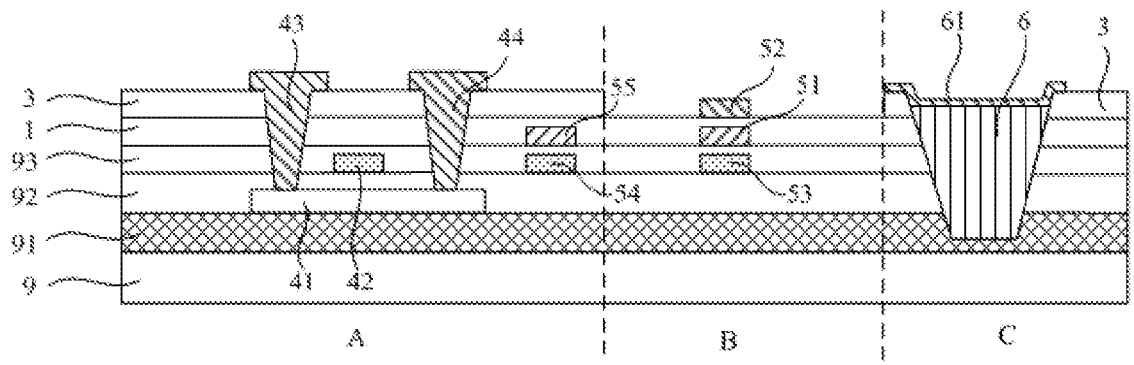
FIG. 5 is a schematic cross-sectional view of a structure after forming a second lead in a method for fabricating a display substrate according to an embodiment of the present disclosure.

A second lead 52 is formed on a surface of the buffer layer 1 on a side of the buffer layer 1 distal to the first lead 51 and in the frame area B by a patterning process, resulting in the structure as shown in FIG. 5. The second lead 52 is configured to introduce a specific signal into the display area A and at least partially overlaps with the first lead 51 as viewed in a vertical direction.

Of course, it should be understood that although the first lead 51, the second lead 52, and the third lead 53 are overlapped in the drawing as viewed in the vertical direction, their positions, directions, and the like are not necessarily the same as long as the first lead 51 and the second lead 52 intersect with each other at a position as viewed in the vertical direction.

As described above, because the buffer layer 1 in the frame area B is covered by the protective layer 11 during the cleaning process, no crack will be caused in the buffer layer 1 by the cleaning process, and the second lead 52 will not be electrically coupled to the first lead 51 in the absence of the crack, thereby avoiding the short-circuit failure.

Optionally, this step (S206) may further include: simultaneously forming the source 43 and the drain 44 of the thin film transistor The source 43 and the drain 44 disposed in the same layer as the second lead 52 may be simultaneously formed while forming the second lead 52, so as to simplify the process. Of course, it should be understood that the source 43 and the drain 44 are respectively coupled to the active region 41 through the connection via holes 21, so as to form a complete thin film transistor.

Of course, other structures disposed in the same layer as the second lead 52, such as a sealing structure 61 on the filling structure 6 in the bendable area C, may also be formed simultaneously in this step to prevent moisture and oxygen from entering the flexible structure.

At step S207, fabrication of the display substrate is completed.

Figure 6:
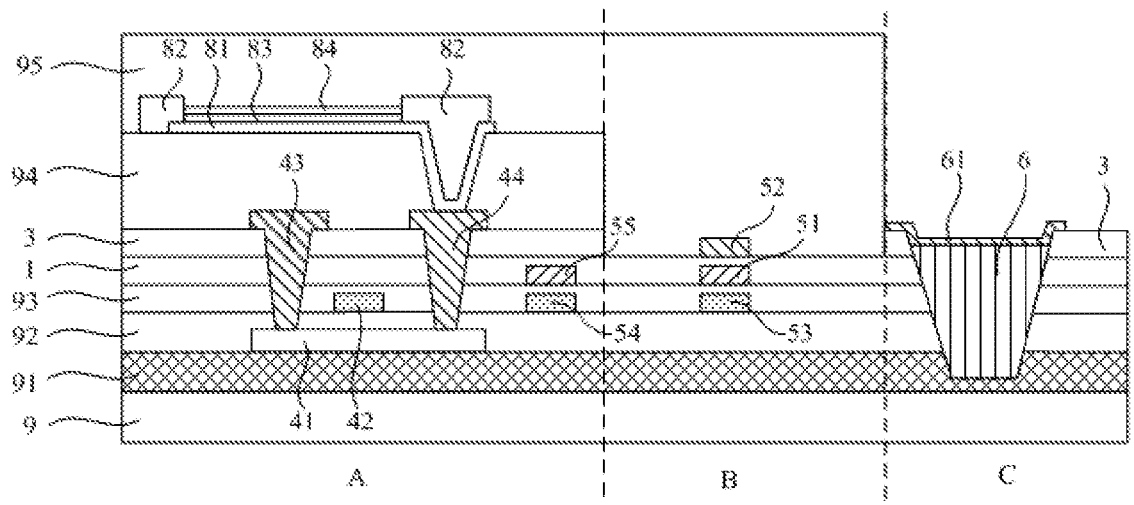
FIG. 6 is a schematic cross-sectional view of a structure of a display substrate according to an embodiment of the present disclosure.

After the second lead 52 is formed, other structures such as a planarization layer 94, an anode 81, a pixel defining layer (PDL) 82, a light emitting layer 83, a cathode 84, and an encapsulation layer 95 may be fabricated, resulting in the flexible organic light emitting diode display substrate as shown in FIG. 6.

Due to various specific forms of the other structures, reference may be made to the corresponding structures in the related art, and therefore, the detailed description thereof will not be provided herein.

Third Embodiment

Figure 7:
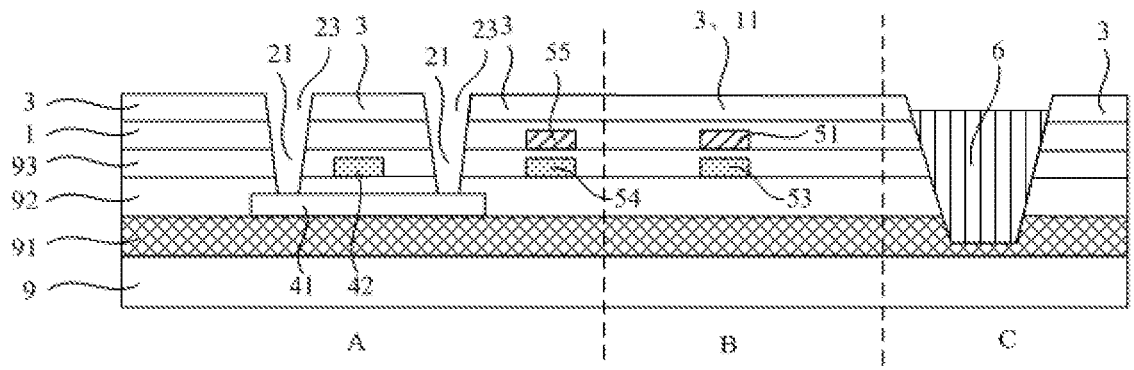
FIG. 7 is a schematic cross-sectional view of a structure before cleaning in another method for fabricating a display substrate according to an embodiment of the present disclosure.

Referring to FIG. 7, an embodiment of the present disclosure provides a method for fabricating a display substrate.

The method for fabricating a display substrate in this embodiment is similar to the method for fabricating a display substrate in the second embodiment. The difference is that in the present embodiment, an insulating interlayer layer 3 made of an organic material is used as the protective layer 11.

Most of the steps in the present embodiment are the same as those in the second embodiment, and only different steps will be described below.

The step (S203) of forming a protective layer 11 and a connection via hole 21 in the present embodiment includes steps S3031 to S3033.

At step S3031, a pattern of an insulating interlayer layer 3 is formed using an organic material, the insulating interlayer layer 3 is provided with a first opening 23, an orthogonal projection of the first opening 23 on the base substrate 9 coincides with an orthogonal projection on the base substrate 9 of a region where the connection via hole 21 is to be formed, and part of the insulating interlayer layer 3 in the frame area B directly covers the buffer layer 1 and serves as the protective layer 11.

That is, the pattern of the insulating interlayer layer 3 may be changed to directly cover the buffer layer 1 in the frame area B, so that the insulating interlayer layer 3 in the frame area B is also the protective layer 11.

Of course, in this case, since the frame area B has the insulating interlayer layer 3, it is no longer necessary to form a photoresist layer in the frame area B.

Alternatively, the insulating interlayer layer 3 may also be provided with the above second opening 24 in the bendable area C.

At step S3032, a connection via hole 21 communicating with the active region 41 is formed by etching using the insulating interlayer layer 3 as a mask.

The connection via hole 21 corresponding to the first opening 23 is formed by etching using the insulating interlayer layer 3 as a mask. Of course, if the insulating interlayer layer 3 is further provided with the second opening 24, the groove 22 corresponding to the second opening 24 may also be simultaneously formed.

At step S3033, a filling structure 6 is formed in the groove 22 using a flexible material.

When the groove 22 is formed, a filling structure 6 may further be formed, resulting in the structure as shown in FIG. 7.

Accordingly, the step (S205) of removing the protective layer 11 in the frame area B of the present embodiment includes:

step S305: removing the insulating interlayer layer 3 in the frame area B, and keeping the insulating interlayer layer 3 in other area than the frame area B.

In this case, since the insulating interlayer layer 3 serving as the protective layer 11 is provided in the frame area B, it is necessary to separately remove the insulating interlayer layer 3 (protective layer 11) in the frame area B by a patterning process, while keeping the insulating interlayer layer 3 at other positions (because it is not the protective layer), thereby resulting in the structure of the second embodiment as shown in FIG. 4.

Fourth Embodiment

Figure 8:
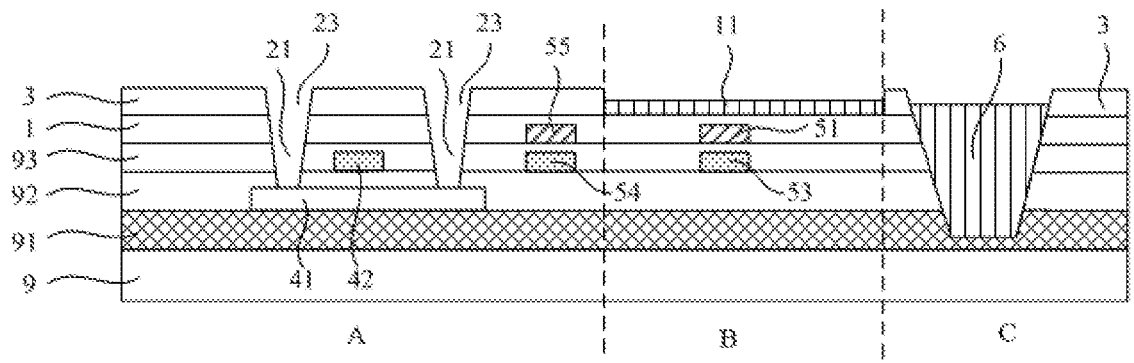
FIG. 8 is a schematic cross-sectional view of a structure before cleaning in still another method for fabricating a display substrate according to an embodiment of the present disclosure.

Referring to FIG. 8, the present embodiment provides a method for fabricating a display substrate.

The method for fabricating a display substrate in this embodiment is similar to the method for fabricating a display substrate in the second embodiment. The difference is that in the present embodiment, a protective layer 11 in the same layer as the filling structure 6 is adopted.

Most of the steps in the present embodiment are the same as those in the second embodiment, and only different steps will be described below.

The step (S203) of forming a protective layer 11 and a connection via hole 21 in the present embodiment includes steps S4031 to S4034.

At step S4031, a pattern of an insulating interlayer layer 3 is formed using an organic material, the insulating interlayer layer 3 has a first opening 23 and a second opening 24, an orthographic projection of the first opening 23 on the base substrate 9 coincides with an orthographic projection on the base substrate 9 of a region where the connection via hole 21 is to be formed, an orthographic projection of the second opening 24 on the base substrate 9 coincides with an orthographic projection on the base substrate 9 of a region where the groove 22 is to be formed, and the insulating interlayer layer is not provided in the fame area B.

That is, the insulating interlayer layer 3 having the first opening 23 and the second opening 24 is formed, and the insulating interlayer layer 3 is not distributed in the frame area B.

At step S4032, a photoresist layer 7 is formed in the frame area B.

Since the insulating interlayer layer 3 does not cover the frame area B, it is necessary to separately form a photoresist layer 7 in the frame area B, resulting in the structure of the second embodiment as shown in FIG. 2 (except that the photoresist layer 7 is not the protective layer).

At step S4033, by using the insulating interlayer layer 3 and the photoresist layer 7 as a mask, a connection via hole 21 communicating with the active region 41 is formed by etching, and a groove 22 corresponding to the second opening 24 is simultaneously formed.

The insulating layers (the first insulating layer 93, the gate insulating layer 92, and the buffer layer 1) exposed by the first opening 23 and the second opening 24 are removed by etching using the insulating interlayer layer 3 and the photoresist layer 7 as a mask, and the connection via hole 21 and the groove 22 are formed.

At step S4034, the photoresist layer 7 is removed.

The photoresist layer 7 in the frame area B is removed by photoresist stripping, ashing, or the like.

At step S4035, a filling structure 6 is formed in the groove 22 using a flexible material, and a protective layer 11 is formed in the frame area B simultaneously.

While forming the filling structure 6, a flexible material film layer in the same layer as the filling structure is formed in the frame area B as the protective layer 11, and the structure as shown in FIG. 8 is obtained.

Optionally, the thickness of the protective layer 11 in the frame area B is smaller than the thickness of the filling structure 6, for example, the thickness of the protective layer 11 may be 0.05 µm to 1 µm.

The above difference in thickness can be achieved in various ways. For example, the material (e.g., polyimide) of the filling structure 6 may be added into the groove 22 and spread to the frame area B by spin coating, so that a thin protective layer 11 is formed in the fame area B only after the groove 22 is substantially filled up to form the filling structure 6. For another example, the protective layer 11 may be formed by a step exposure process, that is, a film layer with a same thickness is first formed in the frame area B and the groove 22, and then step exposure and development are performed to locally thin the film layer in the frame area B, thereby forming the protective layer 11.

The step (S205) of removing the protective layer 11 in the frame area B of the present embodiment includes:

step S405, removing the flexible material in the frame area B, and keeping the filling structure 6.

Since the protective layer 11 is a flexible material disposed in the same layer as the filling structure 6, the flexible material (i.e., the protective layer 11) on the buffer layer 3 in the frame area B needs to be removed separately in this step, and the filling structure 6 (because it is not the protective layer) is kept, so as to obtain the structure of the second embodiment as shown in FIG. 4.

The removing process may be implemented using a patterning process, that is, the protective layer 11 in the frame area B is separately removed by a patterning process.

Alternatively, the removing process may be implemented using an ashing process, that is, the protective layer 11 and the filling structure 6 are thinned simultaneously by an ashing process, and because the thickness of the protective layer 11 is much smaller than the thickness of the filling structure 6, the filling structure 6 is substantially kept when the protective layer 11 is thinned to disappear.

Fifth Embodiment

An embodiment of the present disclosure provides a display substrate, which is fabricated by any one of the above methods for fabricating a display substrate.

For example, as shown in FIG. 6, the display substrate of the present disclosure may include a base substrate 9; a barrier layer 91 on the base substrate 9; an active region 41 of a thin film transistor in the display area A and on a side of the barrier layer 91 distal to the base substrate 9; a gate insulating layer 92 on a side of the active region 41 and the barrier layer 91 distal to the base substrate 9; a gate 42 of the thin film transistor in the display area A and on a side of the gate insulating layer 92 distal to the active region 41; a first insulating layer 93 on a side of the gate 42 and the gate insulating layer 92 distal to the barrier layer 91; a first lead 51 in the frame area B and on a side of the first insulating layer 93 distal to the gate insulating layer 92; a buffer layer 1 on a side of the first lead 51 distal to the first insulating layer 93 and covering the first lead 51; an insulating interlayer layer 3 on a side of the buffer layer 1 distal to the first insulating layer 93, the insulating interlayer layer 3 not being disposed in the frame area B; a second lead 52 in the frame area B and on a side of the buffer layer 1 distal to the first lead 51, an orthographic projection of the second lead 52 on the base substrate 9 and an orthographic projection of the first lead 51 on the base substrate 9 at least partially overlapping; and a source 43 and a drain 44 in the display area A and on a side of the insulating interlayer layer 3 distal to the buffer layer 1. The buffer layer has a thickness between 10 nm and 200 nm, and is made of an inorganic material. The source 43 and the drain 44 are coupled to the active region 41 through via holes 21 penetrating through the insulating interlayer layer 3, the buffer layer 1, the first insulating layer 93, and part of the gate insulating layer 92 to communicate with the active region 41, respectively.

In the embodiment, the display substrate may further include a bendable area C in which the base substrate 9, the barrier layer 91, the gate insulating layer 92, the first insulating layer 93, the buffer layer 1, and the insulating interlayer layer 3 are disposed. The bendable area C is provided with a groove 22, and the groove 22 penetrates through the insulating interlayer layer 3, the buffer layer 1, the first insulating layer 93, and the gate insulating layer 92, and enters the barrier layer 91, but does not penetrate through the barrier layer 91. For example, the bottom of the groove 22 has a distance in the range of 10 nm to 100 nm from the base substrate 9 (the total thickness of the barrier layer 91 is greater than the distance). Thus, the film layers in the bendable area C can be removed as much as possible, the bending effect can be improved to the maximum extent, and meanwhile the base substrate 9 can be prevented from being corroded. A filling structure 6 of a flexible material may be formed in the groove 22. The material of the filling structure 6 may be Polyimide (PI) or the like, which is flexible and thus will not adversely affect the bending.

The display substrate may further include other conventional structures such as a planarization layer 94, an anode 81, a pixel defining layer (PDL) 82, a light emitting layer 83, a cathode 84, and an encapsulation layer 95, and the structures thereof can refer to conventional structures and will not be described in detail herein.

The display substrate can be fabricated by any one of the methods of the above embodiments, so that the display substrate has the structure formed by each step of the method, and the buffer layer does not have a crack even if the thickness of the buffer layer is small, so that the conduction between the first lead and the second lead can be avoided, and the short-circuit defect can be eliminated.

Sixth Embodiment

An embodiment of the present disclosure provides a display device, which includes the above display substrate.

Specifically, the display device may be any product or component having a display function, such as a liquid crystal display panel (LCD), an Organic Light Emitting Diode (OLED) display panel, an electronic paper, a mobile phone, a tablet computer, a television, a display, a notebook computer, a digital photo frame, a navigator, or the like.

It could be understood that the above implementations are merely exemplary implementations employed to explain the principle of the present disclosure, but the present disclosure is not limited thereto. Various modifications and improvements can be made by those skilled in the art without departing from the spirit and scope of the present disclosure, and such modifications and improvements are also considered to be within the protection scope of the present disclosure.

What is claimed is:

1. A method for fabricating a display substrate, the display substrate comprising a base substrate, and having a display area and a frame area; the method comprising:
    forming an active region of a thin film transistor in the display area;
    forming a first lead in the frame area;
    forming a buffer layer directly covering the first lead;
    forming a connection via hole communicating with the active region to expose the active region;
    forming a protective layer directly covering the buffer layer in the frame area;
    cleaning the active region exposed by the connection via hole after forming the protective layer;
    removing the protective layer in the frame area after the cleaning; and
    after removing the protective layer, forming a second lead in the frame area, wherein an orthographic projection of the second lead on the base substrate and an orthographic projection of the first lead on the base substrate are at least partially overlapped.

2. The method for fabricating a display substrate according to claim 1, wherein forming the protective layer directly covering the buffer layer in the frame area comprises:
    forming a pattern of a photoresist layer, wherein an orthographic projection of the photoresist layer on the base substrate is not overlapped with an orthographic projection on the base substrate of a region where the connection via hole is to be formed, and the photoresist layer directly covers the buffer layer in the frame area and serves as the protective layer.

3. The method for fabricating a display substrate according to claim 2, wherein between forming the buffer layer directly covering the first lead and forming the pattern of the photoresist layer, the method further comprises:
    forming a pattern of an insulating interlayer layer using an organic material, wherein the insulating interlayer layer is provided with a first opening, an orthographic projection of the first opening on the base substrate is overlapped with the orthographic projection on the base substrate of the region where the connection via hole is to be formed, and the insulating interlayer layer is not provided in the frame area;
    forming the pattern of the photoresist layer comprises: forming a photoresist layer only in the frame area; and
    forming the connection via hole communicating with the active region comprises: forming a connection via hole communicating with the active region by etching using the insulating interlayer layer and the photoresist layer as a mask.

4. The method for fabricating a display substrate according to claim 1, wherein forming the protective layer directly covering the buffer layer in the frame area comprises:
    forming a pattern of an insulating interlayer layer using an organic material, wherein the insulating interlayer layer is provided with a first opening, an orthographic projection of the first opening on the base substrate is overlapped with an orthographic projection on the base substrate of a region where the connection via hole is to be formed, and the insulating interlayer layer directly covers the buffer layer in the frame area and serves as the protective layer;
    forming the connection via hole communicating with the active region comprises: forming a connection via hole communicating with the active region by etching using the insulating interlayer layer as a mask; and removing the protective layer in the frame area comprises:
 removing the insulating interlayer layer in the frame area, and keeping the insulating interlayer layer in other area than the frame area.

5. The method for fabricating a display substrate according to claim 1, wherein the display substrate is a flexible display substrate, and the display substrate further comprises a bendable area on a side of the frame area distal to the display area; the method further comprises:
 forming a groove in the bendable area, wherein the groove and the connection via hole communicating with the active region are formed in a same step; and
 forming a filling structure in the groove using a flexible material.

6. The method for fabricating a display substrate according to claim 5, wherein forming the protective layer directly covering the buffer layer in the frame area comprises:
 forming the protective layer directly covering the buffer layer in the frame area while forming the filling structure in the groove using the flexible material; and
 removing the protective layer in the frame area comprises: removing the flexible material in the frame area and keeping the filling structure.

7. The method for fabricating a display substrate according to claim 5, wherein before forming the active region of the thin film transistor in the display area, the method further comprises:
 forming a barrier layer; and
 forming the groove in the bendable area comprises: forming, in the bendable area, a groove which enters the barrier layer but does not penetrate through the barrier layer.

8. The method for fabricating a display substrate according to claim 5, wherein before forming the groove in the bendable area, the method further comprises:
 forming a pattern of an insulating interlayer layer using an organic material, wherein the insulating interlayer layer is provided with a first opening and a second opening, an orthographic projection of the first opening on the base substrate is overlapped with an orthographic projection on the base substrate of a region where the connection via hole is to be formed, and an orthographic projection of the second opening on the base substrate is overlapped with an orthographic projection on the base substrate of a region where the groove is to be formed; and
forming a photoresist layer in the frame area;
 forming the connection via hole communicating with the active region comprises: forming a connection via hole communicating with the active region by etching using the insulating interlayer layer and the photoresist layer as a mask; and
 forming the groove in the bendable area comprises: forming a groove in the bendable area by etching using the insulating interlayer layer and the photoresist layer as a mask; and
 before forming the filling structure in the groove using the flexible material, the method further comprises: removing the photoresist layer.

9. The method for fabricating a display substrate according to claim 5, wherein before forming the groove in the bendable area, the method further comprises:
 forming a pattern of an insulating interlayer layer using an organic material, wherein the insulating interlayer layer is provided with a first opening and a second opening, an orthographic projection of the first opening on the base substrate is overlapped with an orthographic projection on the base substrate of a region where the connection via hole is to be formed, an orthographic projection of the second opening on the base substrate is overlapped with an orthographic projection on the base substrate of a region where the groove is to be formed, and part of the insulating interlayer layer in the frame area serves as the protective layer;
 forming the connection via hole communicating with the active region comprises: forming a connection via hole communicating with the active region by etching using the insulating interlayer layer as a mask;
 forming the groove in the bendable area comprises: forming a groove in the bendable area by etching using the insulating interlayer layer as a mask; and
 removing the protective layer in the frame area comprises: removing the insulating interlayer layer in the frame area, and keeping the insulating interlayer layers in other area than the frame area.

10. The method for fabricating a display substrate according to claim 1, wherein between forming the active region of the thin film transistor in the display area and forming the first lead in the frame area, the method further comprises:
 forming a gate insulating layer;
 forming a gate of the thin film transistor; and
 forming a first insulating layer.

11. The method for fabricating a display substrate according to claim 1, further comprising:
 forming a source and a drain of the thin film transistor;
 wherein the source and the drain of the thin film transistor are formed in the same step as the second lead in the frame area.

12. The method for fabricating a display substrate according to claim 1, wherein the buffer layer is made of an inorganic material.

13. The method for fabricating a display substrate according to claim 1, wherein a thickness of the buffer layer is between 10 nm and 200 nm.

14. The method for fabricating a display substrate according to claim 1, wherein cleaning the active region exposed by the connection via hole comprises:
 cleaning the active region exposed by the connection via hole using a cleaning agent containing hydrogen fluoride.

15. The method for fabricating a display substrate according to claim 1, wherein the display substrate is an organic light emitting diode display substrate.

16. The method for fabricating a display substrate according to claim 1, wherein the display substrate is a flexible display substrate.

* * * * *